(12) United States Patent
Takahashi et al.

(10) Patent No.: US 10,294,565 B2
(45) Date of Patent: May 21, 2019

(54) SUBSTRATE PROCESSING APPARATUS

(71) Applicant: TOKYO ELECTRON LIMITED, Tokyo (JP)

(72) Inventors: Kiichi Takahashi, Oshu (JP); Yuya Sasaki, Oshu (JP); Kosuke Takahashi, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 207 days.

(21) Appl. No.: 15/296,588

(22) Filed: Oct. 18, 2016

(65) Prior Publication Data
US 2017/0114461 A1 Apr. 27, 2017

(30) Foreign Application Priority Data

Oct. 21, 2015 (JP) .................................. 2015-207362

(51) Int. Cl.
*C23C 16/455* (2006.01)

(52) U.S. Cl.
CPC .. *C23C 16/45563* (2013.01); *C23C 16/45544* (2013.01); *C23C 16/45551* (2013.01); *C23C 16/45578* (2013.01)

(58) Field of Classification Search
CPC ........ C23C 16/45563; C23C 16/45551; C23C 16/45544; C23C 16/45578

USPC ......................... 118/715; 156/345.29, 345.33
See application file for complete search history.

(56) References Cited

U.S. PATENT DOCUMENTS 6,328,221 B1 * 12/2001 Moore .............. C23C 16/45563
118/715
2016/0215395 A1 * 7/2016 Honma ............. C23C 16/45548

FOREIGN PATENT DOCUMENTS

JP 2010-135510 A 6/2010
JP 2015-001009 1/2015

* cited by examiner

*Primary Examiner* — Rudy Zervigon
(74) *Attorney, Agent, or Firm* — Nath, Goldberg & Meyer; Jerald L. Meyer

(57) ABSTRACT

A substrate processing apparatus includes a first hole portion formed through a sidewall of the process chamber and horizontally extending outward and a second hole portion formed to be contiguous with the first hole portion and defining a supply channel for a process gas. The apparatus also includes a gas nozzle, a plurality of seal members and an annular spacer. A proximal end of the gas nozzle is inserted into the first hole portion. The plurality of seal members is spaced apart from each other between an outer circumferential surface of the gas nozzle and the first hole portion. The annular spacer is inserted into the first hole portion and is pressed against an annular surface of an opening periphery of the second hole portion by the gas nozzle in a state where the proximal end of the gas nozzle is engaged with the annular spacer.

7 Claims, 13 Drawing Sheets

SUBSTRATE PROCESSING APPARATUS

CROSS-REFERENCE TO RELATED APPLICATION

This application claims the benefit of Japanese Patent Application No. 2015-207362, filed on Oct. 21, 2015, in the Japan Patent Office, the disclosure of which is incorporated herein in its entirety by reference.

TECHNICAL FIELD

The present disclosure relates to a substrate processing apparatus which supplies a process gas to a substrate in a process chamber to perform processing.

BACKGROUND

For formation of a thin film such as a silicon oxide layer on a substrate such as a semiconductor wafer (hereinafter, "wafer"), a film formation apparatus based on atomic layer reposition (ALD) is known in the art. In the film formation apparatus based on ALD, a plurality of wafers placed on a rotary table in a vacuum chamber is revolved by the rotary table so as to sequentially pass through a region to which a source gas is supplied and a region to which a reaction gas is supplied. In this apparatus, the source gas is supplied through a gas nozzle extending in a radial direction of the rotary table and having gas discharge holes formed in a longitudinal direction thereof. In order to improve in-plane uniformity of the film forming process by allowing the source gas to be adsorbed onto the wafer with high in-plane uniformity, the gas nozzle is required to be placed parallel to the wafer.

For example, a technique on a structure of mounting a gas nozzle has been known. In the technique, a sleeve is inserted into a through-hole formed through a sidewall of a process chamber, which is a vacuum chamber, from the outside of the process chamber, and a proximal end of a gas nozzle is inserted into the through-hole from the inside of the process chamber (a process space) to be engaged with an inner circumferential surface of the sleeve. Then, seal members (O-rings) are disposed at intervals in an axial direction between an outer circumferential surface of the proximal end of the gas nozzle and an inner circumferential surface of the sleeve to achieve hermetic sealing, and a process gas is supplied to the gas nozzle through a gas supply channel that is in fluid communication with the through-hole.

However, when the operation time of the film formation apparatus is lengthened, the seal members soften and the height of a leading end of the gas nozzle is lowered from an initial height thereof, thereby causing the gas nozzle to be microscopically deflected. Thus, there is a concern that it is difficult to maintain a low maintenance frequency.

SUMMARY

Some embodiments of the present disclosure provide a technique which can maintain a posture of a gas nozzle for a long time in supplying a process gas to a substrate through a gas nozzle securely supported at one side by a sidewall of a hermetic process chamber.

According to one embodiment of the present disclosure, there is provided a substrate processing apparatus which supplies a process gas to a substrate placed in a hermetic process chamber to perform substrate processing, including: a first hole portion formed through an inner circumferential surface of a sidewall of the process chamber and horizontally extending outward, the first hole portion having a circular cross-section; a second hole portion formed through the sidewall of the process chamber to be contiguous with an outer end of the first hole portion and defining a supply channel for the process gas, the second hole portion being concentric with the first hole portion and having a smaller diameter than the first hole portion and a circular cross-section; a gas nozzle, a proximal end of which is inserted into the first hole portion through an inner end of the first hole portion, the gas nozzle being configured to supply the process gas from the second hole portion to the substrate; a plurality of seal members spaced apart from each other in a longitudinal direction of the gas nozzle between an outer circumferential surface of the gas nozzle and the first hole portion, the seal member being formed in an annular shape in a circumferential direction of the gas nozzle; and an annular spacer inserted into the outer end of the first hole portion and pressed against an annular surface of an opening periphery of the second hole portion by the gas nozzle in a state where the proximal end of the gas nozzle is engaged with the annular spacer.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
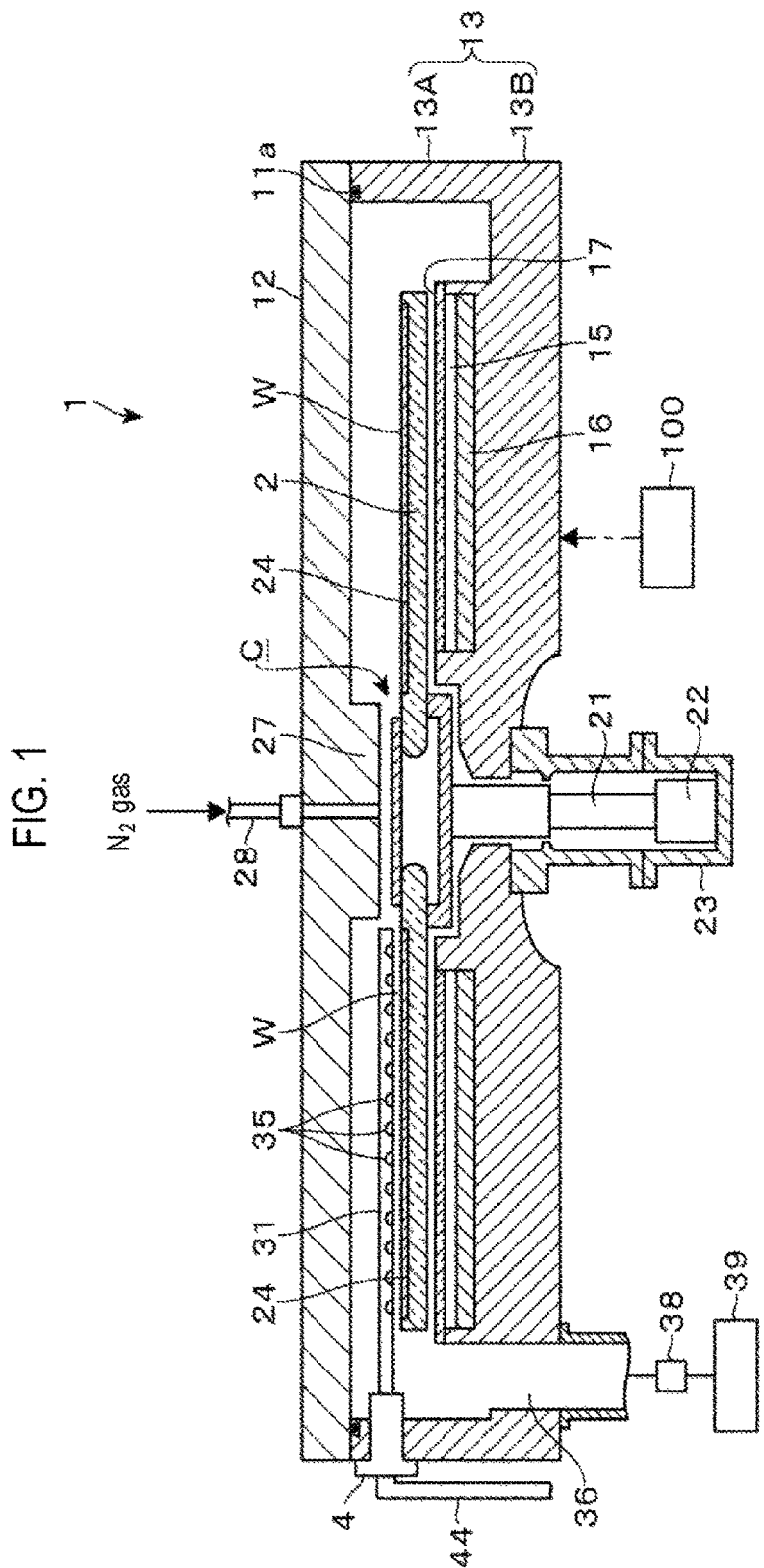
FIG. 1 is a longitudinal sectional view of a film formation apparatus which is an embodiment of a substrate processing apparatus of the present disclosure.
Figure 2:
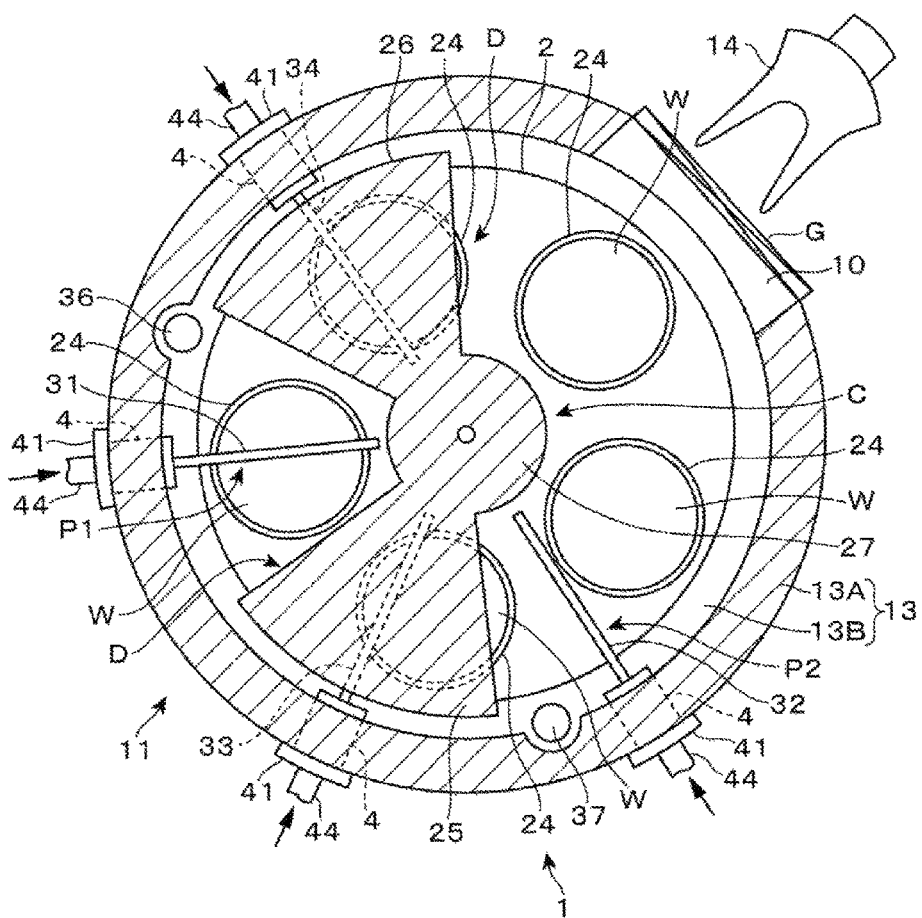
FIG. 2 is a plan view of the film formation apparatus.
Figure 3:
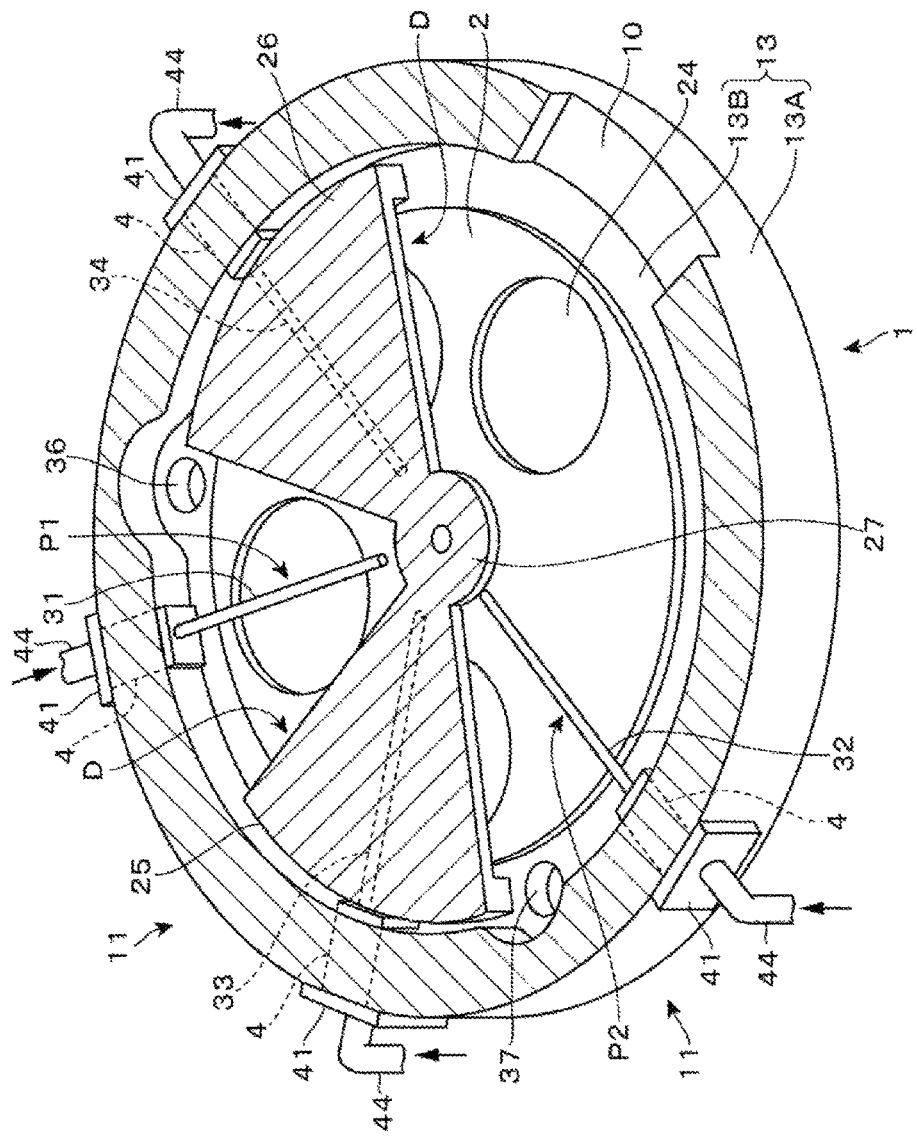
FIG. 3 is a perspective view of a vacuum chamber of the film formation apparatus.

Hereinafter, a film formation apparatus which is an embodiment of a substrate processing apparatus of the present disclosure will be described with reference to FIGS. 1 to 3. FIGS. 1 and 2 are a side view of a vertical section and a plan view of the film formation apparatus 1, respectively, and FIG. 3 is a perspective view of a vacuum chamber 11 (process chamber) of the film formation apparatus 1. The film formation apparatus 1 includes a rotary table 2 configured to be rotatable around a vertical axis thereof in a hermetic vacuum chamber 11 and supplies a process gas to a wafer W loaded on the rotary table 2 through a gas nozzle to perform a film forming process by an ALD method.

The vacuum chamber 11 has a generally circular shape in plan view and includes a ceiling plate 12 and a chamber main body 13. A sidewall and a base plate of the chamber main body 13 are denoted by 13A and 13B, respectively. In FIG. 1, reference numeral 11A denotes a seal member sealing the ceiling plate 12 against the sidewall 13A. In FIGS. 2 and 3, reference numeral 10 denotes a transfer hole formed through the sidewall 13A such that a wafer W can be transferred therethrough, and reference mark G denotes a gate valve for opening/closing the transfer hole 10. In FIG. 2, reference numeral 14 denotes a transfer mechanism which transfers the wafer W between the inside and the outside of the vacuum chamber 11 through the transfer hole 10.

As shown in FIG. 1, an annular recess 15 is formed in the base plate 13B of the vacuum chamber 11 in a circumferential direction of the vacuum chamber 11, and a heater unit 16 is placed within the recess 15 to heat the wafer W to, for example, a temperature of 300 degrees C. to 600 degrees C. through the rotary table 2 during the film forming process. In FIG. 1, reference numeral 17 denotes a cover member covering the recess 15.

In FIG. 1, reference numeral 21 denotes a shaft supporting the center of the rotary table 2. In FIG. 1, reference numeral 22 denotes a rotary mechanism which rotates the rotary table 2 around the vertical axis, for example, in the clockwise direction, through the shaft 21. In FIG. 1, reference numeral 23 denotes a casing receiving the shaft 21 and the rotary mechanism 22, and, as a purge gas, nitrogen ($N_2$) gas is supplied into the casing 23 through a gas supply pipe (not shown) during the film forming process.

As shown in FIGS. 2 and 3, five circular recesses 24 are formed on a surface of the rotary table 2 at intervals in the circumferential direction (rotational direction) of the rotary table 2, and each of the recesses 24 is configured to receive a wafer W. The base plate 13B of the vacuum chamber 11 is provided with a lift pin for transferring the wafer W between a recess 24 facing the transfer hole 10 and the transfer mechanism 14, and a through-hole through which the lift pin passes is formed through a bottom of the recess 24. In the drawings, the lift pin and the through-hole are not shown.

Rotation of the rotary table 2 causes the recess 24 to revolve, and, above a region through which the revolving recess 24 passes, four elongated gas nozzles (gas injectors) 31, 32, 33, 34 formed of quartz are placed at intervals in the circumferential direction of the vacuum chamber 11, and each of the gas nozzles straightly extends from an outer circumferential wall of the vacuum chamber 11 toward the center of the vacuum chamber 11 so as to be parallel to the wafer W. The gas nozzles 31 to 34 are placed in order of 32, 33, 31, 34 in the clockwise direction when seen from the wafer transfer hole 10. Each of the gas nozzles 31 to 34 has a cylindrical shape with a leading end thereof (an end of the gas nozzle at the center of the vacuum chamber 11) closed, and a plurality of gas discharge holes 35 are formed through a lower surface of each of the gas nozzles 31 to 34 in a longitudinal direction of each of the gas nozzles 31 to 34. In FIG. 1, only the gas discharge holes 35 of the gas nozzle 31 are shown.

The gas nozzle 31 discharges a first process gas including silicon (Si), and the gas nozzle 32 discharges $O_3$ gas as a second process gas. Under the gas nozzles 31, 32, a first processing region P1 for adsorbing the first process gas onto the wafer W and a second processing region P2 for the reaction between the first process gas adsorbed onto the wafer W and the second process gas are formed, respectively. The gas nozzles 33, 34 discharge $N_2$ gas, which is a division gas, to a division region D for dividing the processing regions P1, P2 from each other, and the division region will be described in detail below.

Figure 4:
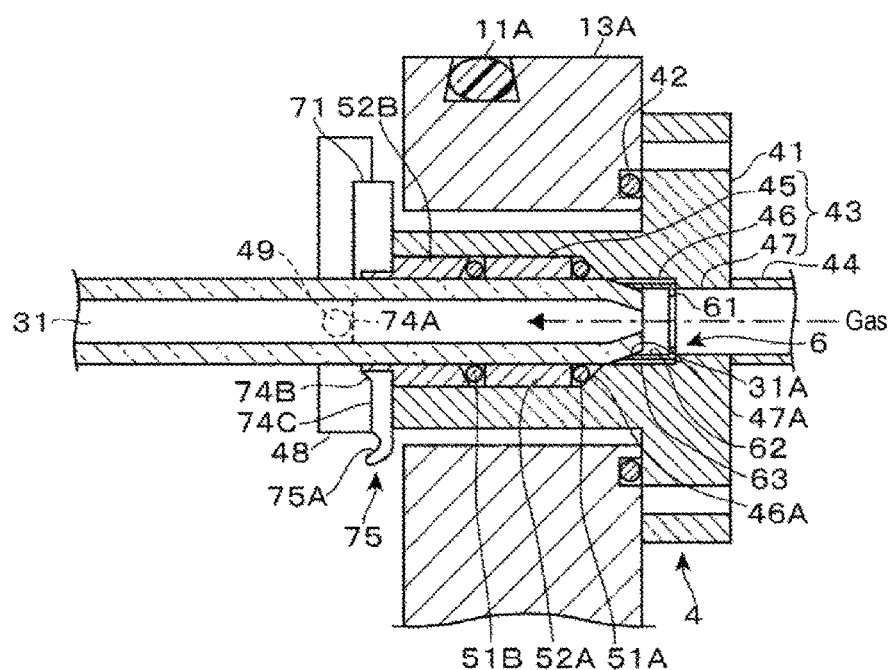
FIG. 4 is a side view of a vertical section of a gas supply port formed in a sidewall of the vacuum chamber.
Figure 5:
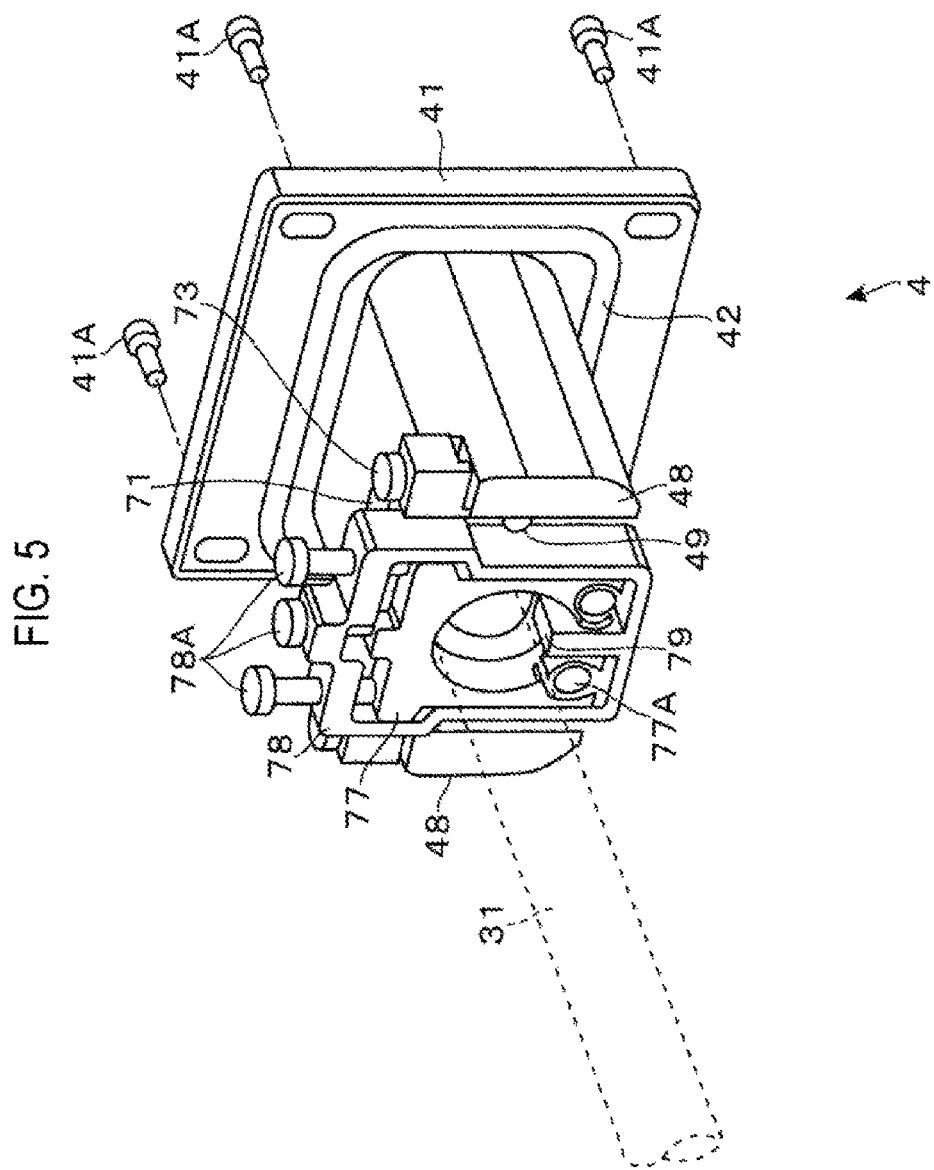
FIG. 5 is a perspective view of the gas supply port.

In order to supply the respective gases to the gas nozzles 31 to 34, each of the gas nozzles is provided with a gas supply port 4 constituting a sleeve surrounding a proximal end of the gas nozzle, and the gas nozzles 31 to 34 are detachably mounted on the respective gas supply ports 4. Next, the gas supply port 4 for the gas nozzle 31 will be representatively described with reference to a side view of a vertical section of FIG. 4, a perspective view of FIG. 5, an exploded perspective view of FIG. 6, and a vertical section perspective view of FIG. 7. The gas supply port 4 is formed of, for example, a metal such as SUS (stainless steel) and is hermetically mounted at the outside of the vacuum chamber 11 to pass through the sidewall 13A of the vacuum chamber 11.

The gas supply port 4 has a generally square tube shape extending in the radial direction of the rotary table 2 and forms a portion of the sidewall 13A of the vacuum chamber 11. One end of the gas supply port 4 in an outer side the vacuum chamber 11 forms a flange 41 and is fixed to an outer wall of the vacuum chamber 11 through a bolt 41A (only shown in FIG. 5). In the drawings, reference numeral 42 denotes an O-ring sealing a gap between the flange 41 and the outer wall of the vacuum chamber 11.

The gas supply port 4 is formed with a through-hole 43 horizontally extending from the inside of the vacuum chamber 11 (the rotary table 2 side) toward the outside of the vacuum chamber 11. The through-hole 43 is an engagement hole into which the proximal end of the gas nozzle 31 is inserted from the inside of the vacuum chamber 11. In addition, a downstream end of the gas supply pipe 44 is connected to the gas supply port 4 from the outside of the vacuum chamber 11 to supply gas into the through-hole 43. An upstream end of the gas supply pipe 44 is connected to a source of the first process gas (not shown).

Hereinafter, in description of the through-hole and each member placed in the through-hole 43, an end of the through-hole or the member at an outside of the vacuum chamber 11 and an end of the through-hole or the member at an inside of the vacuum chamber 11 will also be referred to as an "outer end" of the through-hole or the member and an "inner end" of the through-hole or the member, respectively. The through-hole 43 is composed of hole portions 45, 46, 47 which have different diameters and adjoin one another, wherein the hole portion 45 and the hole portion 47 form an inner end of the through-hole 43 and an outer end of the through-hole 43, respectively, and the hole portion 46 is formed between the hole portions 45, 47. Each of the hole portions 45 to 47 has a circular shape in a vertical sectional view in a hole formation direction, and the hole portions 45 to 47 are concentric.

In terms of the size of the diameter, the following relation is formed: the hole portion 45>the hole portion 46>the hole portion 47, and steps are formed between the hole portion 45 and the hole portion 46 and between the hole portion 46 and the hole portion 47, respectively. An annular surface forming a step between the hole portion 45 and the hole portion 46, forming an opening periphery at an inner end of the hole portion 46, and facing the inner end of the through-hole 43 is denoted by 46A, and an annular surface forming a step between the hole portion 46 and the hole portion 47, forming an opening periphery at an inner end of the hole portion 47, and facing the inner end of the through-hole 43 is denoted by 47A. Further, the hole portions 45, 46 can be referred to as a first hole portion, and the hole portion 47 can be referred to as a second hole portion.

Herein, a configuration of the gas nozzle 31 at the proximal end side thereof is described. An outer circumferential surface of the proximal end of the gas nozzle forms an incline surface 31A inclined in an axial direction of the gas nozzle 31 such that the outer diameter of the gas nozzle 31 gradually decreases toward the proximal end of the gas nozzle 31. Seal members 51A, 51B formed of, for example, an elastomer, are arranged in an annular shape along the circumference of the gas nozzle 31 to be interposed between an inner circumferential surface of the hole portion 45 and an outer circumferential surface of the gas nozzle 31 closer to the leading end of the gas nozzle than the incline surface 31A. The seal members 51A, 51B are O-rings and are spaced apart from each other in the longitudinal direction of the gas nozzle 31.

Further, in the hole portion 45, a sleeve 52A is disposed between the seal members 51A, 51B, and a sleeve 52B is disposed closer to the inner end than the seal members 51A, 51B. Each of the sleeves 52A, 52B has a cylindrical shape surrounding the gas nozzle 31 and is movable in the longitudinal direction of the gas nozzle 31. Further, the sleeves 52A, 52B and the seal members 51A, MB are placed to overlap with the annular surface 46A, when seen in a direction of an opening of the through-hole 43.

Positions of the sleeves 52A, 52B in the hole portion 45 are restricted by a fastening member 71 described below, and the sleeves 52A, 52B compress the seal members 51A, 51B toward the annular surface 46A against resilient force of the seal members 51A, 51B. The compressed seal members 51A, 51B are brought into close contact with the outer circumferential surface of the gas nozzle 31 and the inner circumferential surface of the hole portion 45 while fastening the proximal end of the gas nozzle 31. As a result, the gas nozzle 31 can be securely supported at one side thereof by the gas supply port 4; the hole portion 45 can be hermetically sealed against the hole portion 46; and the first process gas from the gas supply pipe 44 can be introduced into the gas nozzle 31 through the hole portion 47, 46.

An annular spacer 6 formed of, for example, a metal such as SUS is fitted into the hole portion 46 to be concentric with the hole portion 46. Next, the spacer 6 will be described with reference to FIG. 8 which is a side view of a vertical section of the spacer 6. An outer end of the spacer 6 forms a protrusion 61 protruding toward the central axis of the spacer 6 and adjoins the annular surface 47A. An inner circumferential surface of the spacer closer to an inner end of the spacer than the protrusion 61 forms a parallel surface 62 that is parallel to the axis of the spacer 6. An inner circumferential surface of an inner end of the spacer 6 is formed as an incline surface 63 inclined in an axial direction of the spacer 6, and an opening at the inner end of the spacer 3 has an increasing diameter toward the inner end. The incline surface 63 is contiguous with the parallel surface 62.

The incline surface 63 is engaged with a portion of the incline surface 31A of the gas nozzle 31, which is spaced apart from the proximal end of the gas nozzle 31 toward the leading end of the gas nozzle 31, and the proximal end of the gas nozzle 31 is positioned at an inner side than the protrusion 61. Since the seal members 51A, 51B are pushed toward the annular surface 46A by the sleeves 52A, 52B, as described above, the gas nozzle 31 in close contact with the seal members 51A, 51B is forced to move toward the outer end of the hole portion 46. As a result, the proximal end of the gas nozzle 31 is urged to the annular surface 47A through the spacer into which the gas nozzle is fitted. In other words, the spacer 6 is pressed against the annular surface 47A by the proximal end of the gas nozzle 31. Since the spacer 6 is pressed against the annular surface 47A by the gas nozzle 31 in a state where the gas nozzle 31 is fitted into the spacer 6, the spacer 6 can suppress change in a vertical position of the proximal end of the gas nozzle within the hole portion 46. That is, the spacer 6 has a function to suppress the deflection of the leading end of the gas nozzle 31 due to gravity.

As described above, the spacer 6 is formed of a metal and is thus relatively hard. The reason why the spacer 6 is formed such that the it is engaged with the portion of the gas nozzle 31 distant from the proximal end of the gas nozzle is to prevent a corner of the proximal end of the gas nozzle 31 from being damaged due to collision with the spacer 6, which is relatively hard, when the proximal end of the gas nozzle 31 is inserted into the through-hole 43 from the inside of the vacuum chamber 11 in order to mount the gas nozzle 31.

Figure 6:
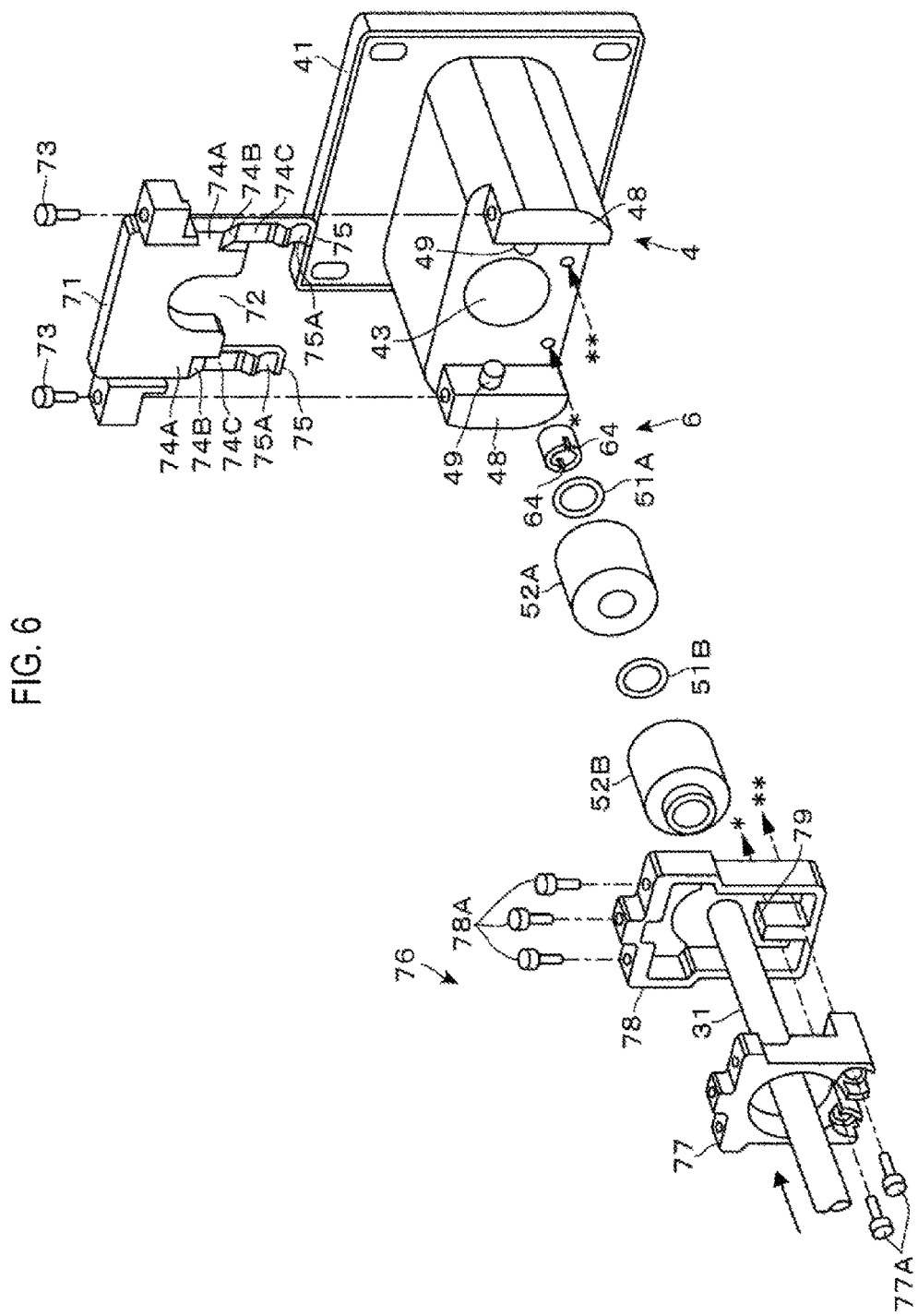
FIG. 6 is an exploded perspective view of the gas supply port.
Figure 7:
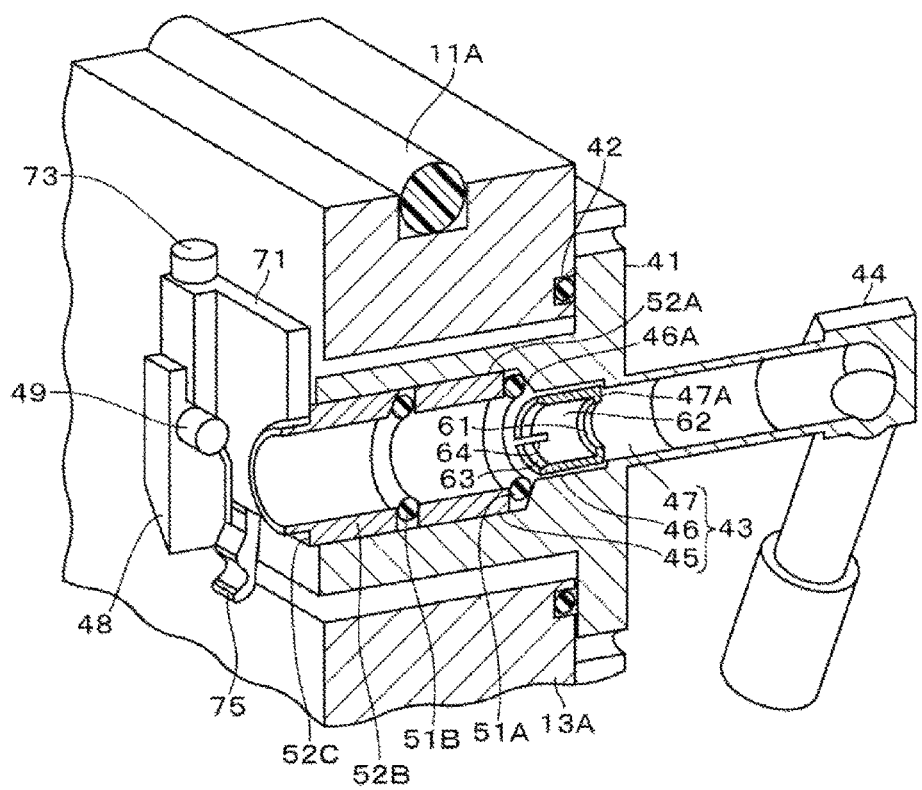
FIG. 7 is a perspective view of a vertical section of the gas supply port.

The spacer 6 has two slits 64 axially extending from an inner end thereof toward an outer end thereof, and the slits 64 are spaced apart from each other in a circumferential direction of the spacer 6 (see FIG. 6). The slits 64 serve to allow the gas nozzle 31 to be easily disengaged from the spacer 6, so that the gas nozzle 31 can be removed from the spacer 6 without being damaged, for example, in the maintenance of the apparatus.

More specifically, the gas nozzle 31 is mounted on the gas supply port 4, for example, in an atmosphere at room temperature. When the film forming process is performed after mounting the gas nozzle, the inside of the vacuum chamber 11 is heated by the heater unit 16, so that the temperature of the spacer 6 increases to a temperature higher than the temperature at the time when the gas nozzle 31 is mounted. As a result, the spacer 6 is thermally expanded. Since the proximal end of the gas nozzle 31 mounted on the gas supply port 4 is pressed against the annular surface 47A in a state where the proximal end is fitted into the spacer 6, the proximal end of the gas nozzle 31 is likely to be moved deep inside the thermally expanded spacer. In this case, the proximal end of the gas nozzle 31 is still located deep inside the spacer even when the vacuum chamber is returned to, for example, a room-temperature atmosphere in which the gas nozzle 31 will be removed after completion of the film forming process. The slits 64 allows the spacer 6 to be bent when the gas nozzle 31 is pulled and removed from the spacer 6 by a worker, whereby the nozzle 31 can be easily removed without being damaged.

In addition, the slits 64 also allow the spacer 6 to be bent when the gas nozzle 31 is fitted into the spacer 6 to mount the gas nozzle 31 on the gas supply port 4. Since the spacer 6 is bent, it is possible to prevent the gas nozzle 31 from being damaged by excessive force applied thereto.

Figure 8:
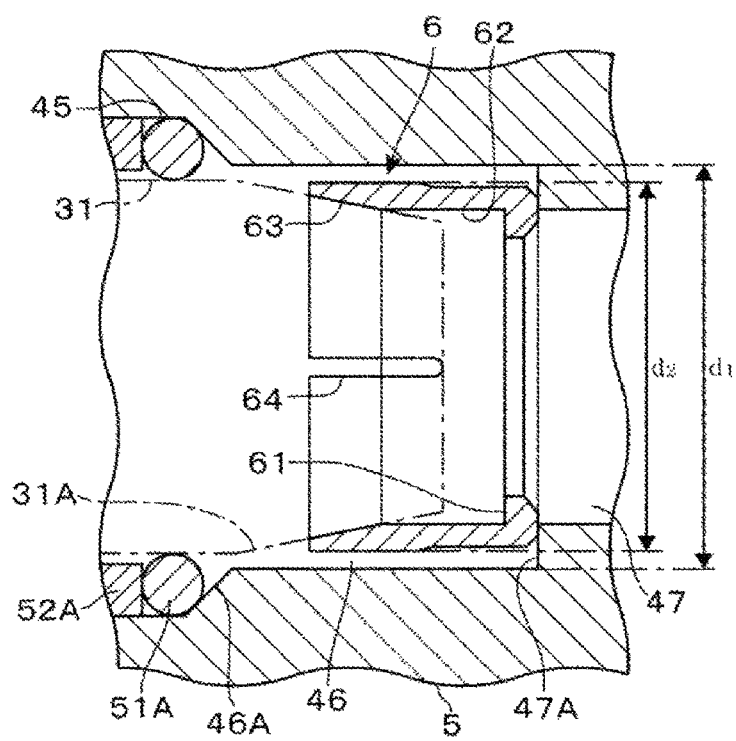
FIG. 8 is a side view of a vertical section of a spacer of the gas supply port.
Figure 9:
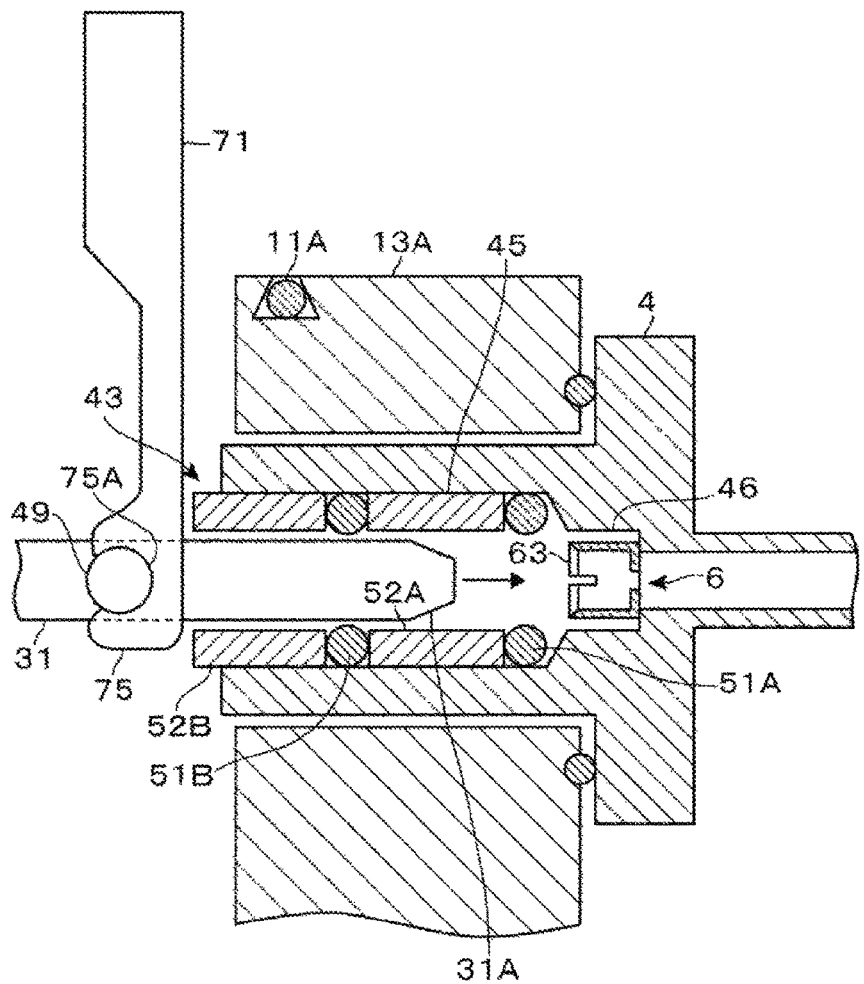
FIG. 9 is a view illustrating a gas nozzle installed in the gas supply port.
Figure 10:
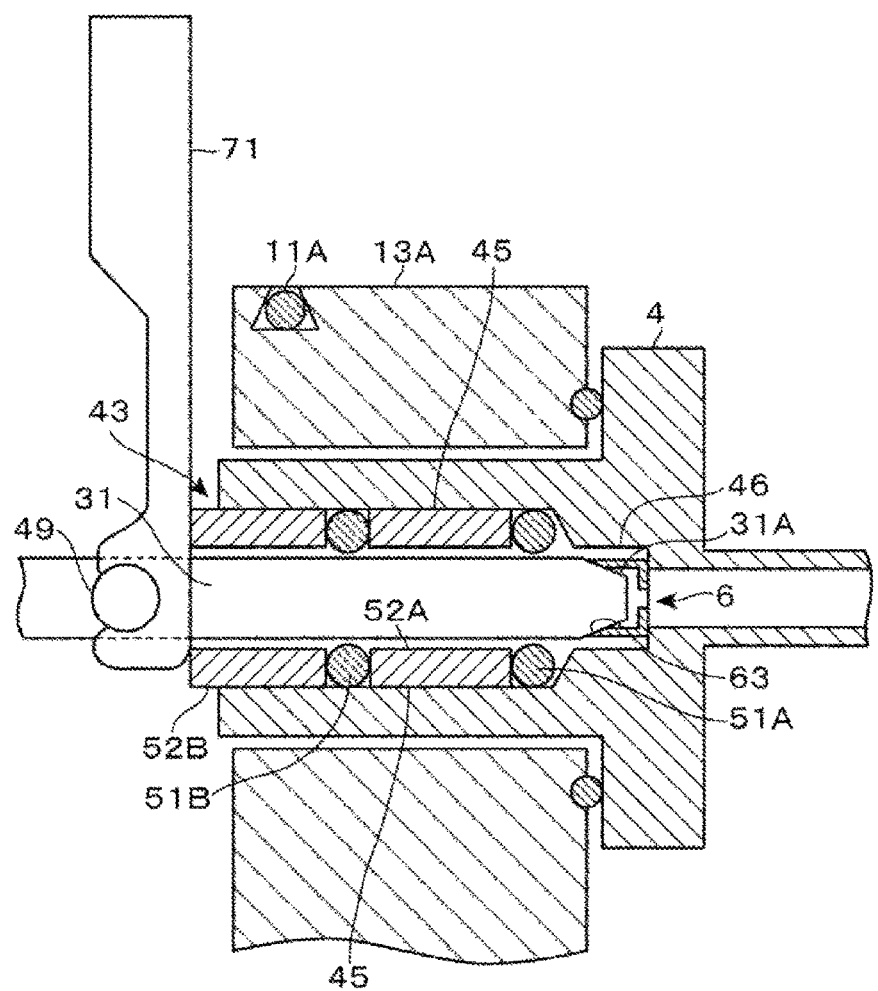
FIG. 10 is a view illustrating a gas nozzle installed in the gas supply port.

The spacer 6 has a clearance of 0.05 mm to 0.20 mm from the inner surface of the hole portion 46 in a radial direction of the hole portion 46 under an atmosphere of the room temperature and atmospheric pressure. In other words, when the diameter of the hole portion 46 and the outer diameter of the spacer 6 are denoted by d1 and d2, respectively, as shown in FIG. 8, d1−d2=0.05 mm to 0.20 mm. Such a clearance allows the inner end of the spacer 6 into which the gas nozzle 31 is fitted to be bent in an outer circumferential direction of the spacer 6 when the spacer 6 is heated and thermally expanded during film forming process, whereby a pressure applied to the gas nozzle 31 by the spacer can be reduced, thereby preventing the gas nozzle 31 from being damaged.

Returning to FIGS. 4 to 7 again, on a cross-section of the gas supply port 4 facing the inside of the vacuum chamber 11 (i.e. facing the rotary table 2), two protrusions 48 protruding toward the inside of the vacuum chamber 11 are formed such that an open end of the through-hole 43 is sandwiched by the protrusions. A pin 49 protrudes from each of the protrusions 48 toward the horizontal center of the gas supply port 4. A generally plate-like vertical fastening member 71 which has a surface facing the inside of the vacuum chamber 11, is placed in a region sandwiched by the two protrusions 48, and the fastening member 71 is vertically movable in a sliding manner in a region behind the pin 49 (i.e., an outer side of the vacuum chamber 11).

In FIG. 6, reference numeral 72 denotes a cutout formed at the horizontal center of the fastening member 71 from the bottom of the fastening member, wherein the cutout receives the gas nozzle 31, and a portion of a rear surface of the fastening member 71 corresponding to the periphery of the cutout 72 pushes the sleeves 52A, 52B toward the annular surface 46A. In FIG. 6, reference numeral 73 denotes a screw member for mounting the fastening member 71 to the gas supply port 4 and for vertical positioning of the fastening member 71 with respect to the gas supply port 4, and the fastening member 71 mounted on the gas supply port through the screw member 73 is slightly movable back and forth (in an inward and outward direction of the vacuum chamber 11).

The other surface (rear surface) of the fastening member 71 is a vertical flat surface. The front surface of the fastening member 71 includes a vertical surface 74A at both sides of the cutout 72. Below the vertical surface 74A, a slanted surface 74B inclined backward is formed to be contiguous with the vertical surface 74A, and, below the slanted surface 74B, a vertical surface 74C is formed to be contiguous with the slanted surface 74B. Thus, a portion of the fastening member having the vertical surface 74A is thicker than a portion of the fastening member having the vertical surface 74C. As the fastening member 71 is moved up and down, the pins 49 of the gas supply port 4 are moved on the surfaces 74A to 74C, such that the front and rear positions of the fastening member 71 are restricted by the pins 49 and the surfaces 74A to 74C.

A bowl portion 75 is formed to extend downward from a portion of the fastening member having the vertical surface 74C, and a recess 75A is formed on a surface of the bowl portion 75. When the gas nozzle 31 is removed from or mounted on the gas supply port 4, the pin 49 is locked in the recess 75A to fix the position of the fastening member 71, in order to avoid any hindrance against the removal or mounting of the gas nozzle 31.

When the gas nozzle 31 is supported by the gas supply port 4 by compressing the seal members 51A, 51B, as described above, the vertical surface 74A is located at the height of the pin 49. As the sleeves 52A, 52B and the fastening member 71 are pushed forward (toward the inside of the vacuum chamber 11) by resilient force of the compressed seal members 51A, 51B, the pin 49 is brought into contact with the vertical surface 74A to restrain the sleeves 52A, 52B and the fastening member 71 from being moved forward, whereby the seal members 51A, 51B can be maintained in the compressed state.

Although only the gas supply port 4 for the gas nozzle 31 has been described above, gas supply ports 4 for other gas nozzles 32 to 34 are substantially the same as the gas supply port 4 for the gas nozzle 31 except that gas sources connected thereto supply gases to be discharged from the gas nozzles 32 to 34.

Next, other components of the film formation apparatus 1 will be described. A tilt angle adjustment member 76 for adjusting the tilt angle of each of the gas nozzles 31 to 34 with respect to the rotary table 2 is placed in front of each of the gas supply ports 4. A tilt angle adjustment member 76 corresponding to the gas nozzle 31 will be representatively described with reference to FIGS. 5 and 6. The tilt angle adjustment member 76 is composed of a main body 77 surrounding the gas nozzle 31 and a frame member 78 placed outside the main body 77. In the drawings, reference numeral 77A denotes a screw member securing the main body 77 to the gas supply port 4. The frame member 78 includes a support 79 supporting the lower surface of the gas nozzle 31 and is configured to be adjustable in vertical position thereof with respect to the main body 77 by a screw member 78A. In the drawings other than FIGS. 5 and 6, the tilt angle adjustment member 76 is not shown.

Returning to FIGS. 1 to 3, protruding portions 25, 26 having a fan shape in plan view and protruding downward are formed on a lower surface of the ceiling plate 12 of the vacuum chamber 11, and the gas nozzles 33, 34 are respectively embedded in lower surfaces of the protruding portions 25, 26 to circumferentially divide the fan shape into two parts. Under the protruding portions 25, 26, there are division regions D where an atmosphere in the processing region P1 is divided from an atmosphere in the processing region P2 in the rotational direction of the rotary table 2 by $N_2$ gas which is a division gas from the gas nozzles 33, 34. Furthermore, the central portion of the ceiling plate 12 of the vacuum chamber is formed as a protrusion 27 having a circular shape in plan view and protruding downwards, and a lower surface of the protrusion 27 is contiguous with the lower surfaces of the protruding portions 25, 26. Thus, the lower surfaces of the protrusion 27 and the protruding portions 25, 26 have a lower height than other portions of the ceiling plate. In FIG. 1, reference numeral 28 denotes a gas supply pipe that supplies $N_2$ gas, as a purge gas, to a central region C under the protrusion 27 to prevent the first process gas from being mixed with the second process gas at the center of the rotary table 2.

As shown in FIGS. 2 and 3, exhaust holes 36, 37 respectively corresponding to the first processing region P1 and the second processing region P2 are formed in a portion of the base plate 13B of the vacuum chamber 11 at an outer periphery of the rotary table 2. The exhaust hole 36 is placed between the first processing region P1 and a division region D located downstream of the first processing region P1 in the rotational direction of the rotary table 2. The exhaust hole 37 is placed between the second processing region P2 and a division region D located downstream of the second processing region P2 in the rotational direction of the rotary table 2. Each of the exhaust holes 36, 37 is connected to a vacuum pump 39, which is an exhaust mechanism, through a pressure adjustment unit 38 for adjustment of exhaust amount (see FIG. 1).

Further, the film formation apparatus includes a computer-based controller 100 for operation control of the entire apparatus. The controller 100 stores a program for executing a film forming process described further below. The program consists of a series of steps for carrying out a film forming process and is installed in the control unit 100 from a computer readable storage medium such as a hard disk, a compact disc, a magneto-optical disc, a memory card, a floppy disk, and the like.

Next, a procedure for mounting the gas nozzle 31 on the gas supply port 4 will be described with reference to FIGS. 9 to 12. First, by a worker, the pin 49 of the gas supply port 4 is locked in the recess 75A of the bowl portion 75 of the fastening member 71 to fix the position of the fastening member 71, and the proximal end of the gas nozzle 31 is inserted into the through-hole 43 from the inside of the vacuum chamber 11. Then, the gas nozzle 31 is pushed toward the outer end of the through-hole 43 (FIG. 10) until the proximal end of the gas nozzle 31 passes through the seal members 51A, 51B and the sleeves 52A, 52B placed in the hole portion 45 of the through-hole 43 (FIG. 9) and the incline surface 31A of the proximal end is brought into contact with the incline surface 63 of the spacer 6 placed in the hole portion 46 of the through-hole 43, such that the incline surface 31A is fitted into the incline surface 63.

Figure 11:
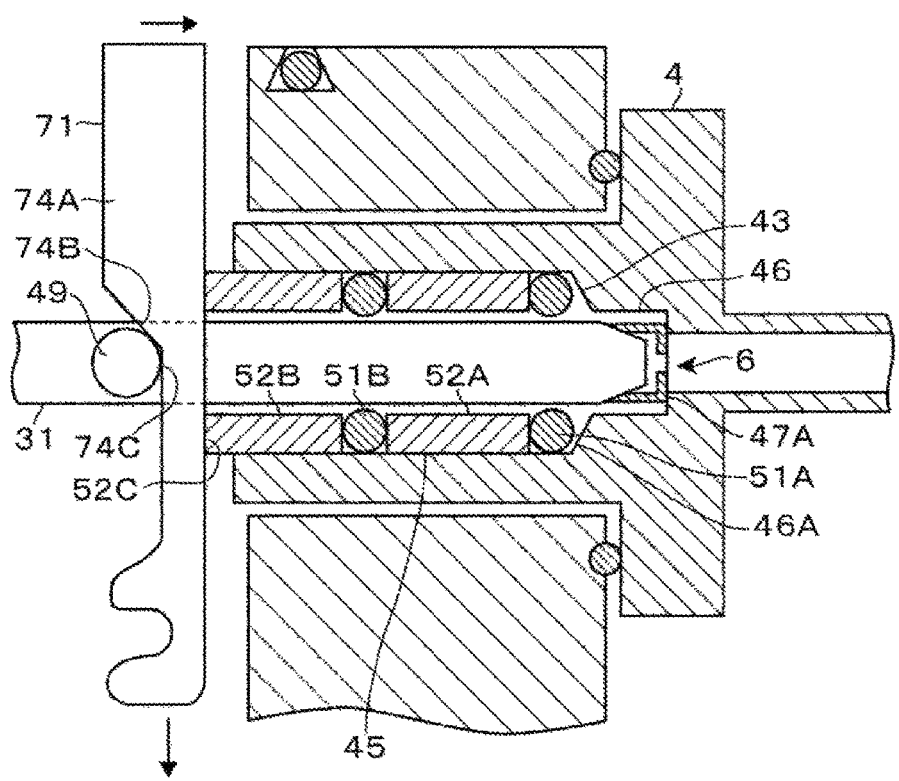
FIG. 11 is a view illustrating a gas nozzle installed in the gas supply port.

Then, by a worker, the pin 49 of the gas supply port 4 is unlocked from the recess 75A of the fastening member 71, and the pin 49 is positioned in front of the vertical surface 74C of the fastening member 71. At this stage, the seal members 51A, 51B are not compressed and the inner end of the sleeve 52B protrudes more forward than the through-hole 43. Then, the fastening member 71 is moved down by a worker. As a result, the slanted surface 74B of the fastening member 71 is seated on the pin 49 and the position of the fastening member is restricted by the pin 49 such that the fastening member 71 is moved backward and the sleeves 52A, 52B are pressed toward the annular surface 46A of the through-hole 43 while the seal members 51A, 51B are pushed toward the annular surface 46A by the sleeves 52A, 52B (FIG. 11).

Figure 12:
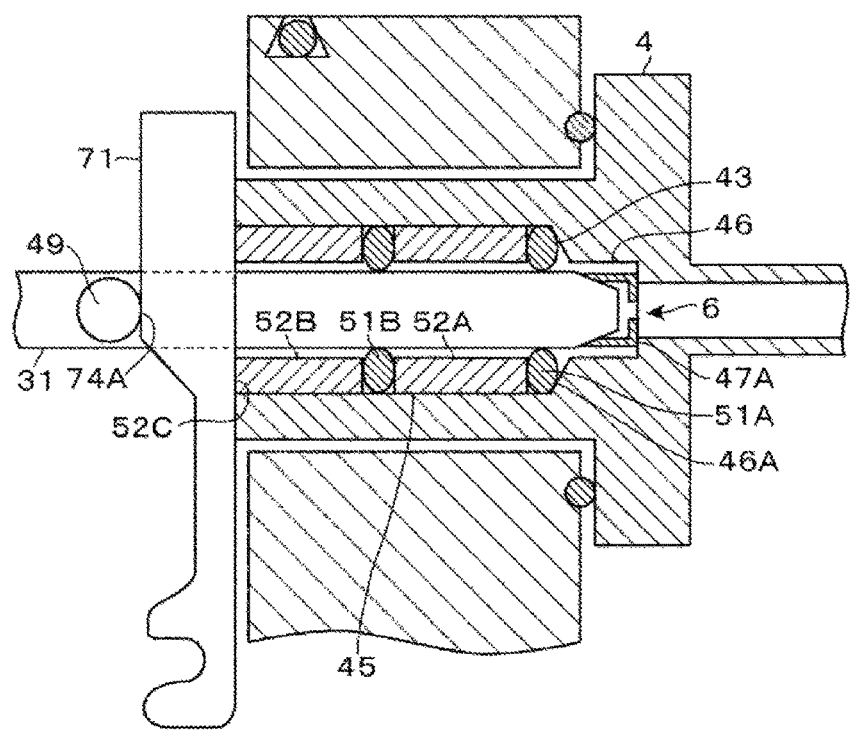
FIG. 12 is a view illustrating a gas nozzle installed in the gas supply port.

As a result, the seal members 51A, 51B are compressed and expanded in a direction perpendicular to the longitudinal direction of the gas nozzle 31 to be brought into close contact with both the inner circumferential surface of the hole portion 45 and the outer circumferential surface of the gas nozzle 31 such that the gas nozzle 31 is supported by the gas supply port 4. Further, the fastening member 71 is lowered and moved backward; the seal members 51A, 51B are pressed toward the annular surface 46A by the sleeves 52A, 52B; and the gas nozzle 31 in close contact with the seal members 51A, 51B is pressed toward the rear end of the through-hole 43. As a result, the proximal end of the gas nozzle 31 is pushed toward the annular surface 47A of the through-hole 43 through the spacer 6 with which the proximal end is engaged such that movement of the proximal end is restrained. When the pin 49 is seated on the vertical surface 74A, downward movement of the fastening member 71 is stopped, whereby mounting of the gas nozzle 31 on the gas supply port 4 is completed (FIG. 12).

Other gas nozzles 32 to 34 are also mounted on the respective gas supply ports 4 in the same manner as the gas nozzle 31. The gas nozzle 31 is removed from the gas supply port 4 in reverse order of mounting.

Next, a film forming process using the film formation apparatus 1 will be described. First, the rotary table 2 is heated by the heater unit 16, and the gate valve G is opened. Then, wafers W transferred into the vacuum chamber 11 by the transfer mechanism 14 are sequentially loaded onto the recesses 24 through intermittent rotation of the rotary table 2 and up/down movement of the lift pin upon stoppage of the rotary table and are heated to a predetermined film formation temperature. When wafers W are loaded in all of the recesses 24, the gate valve G is closed and the vacuum chamber 11 is evacuated to a vacuum by the vacuum pump 39. Then, process gases are discharged to the processing regions P1, P2 from the gas nozzles 31, 32, respectively; a division gas is discharged to the division regions D from the gas nozzles 33, 34; and a purge gas is discharged to the central region C from the gas supply pipe 28, such that the internal pressure of the vacuum chamber 11 is adjusted to a predetermined value.

In the first processing region P1, the first process gas is adsorbed onto a surface of the wafer W to form an adsorption layer. In the second processing region P2, the adsorption layer reacts with the second process gas to form a reaction product (silicon oxide). As the rotary table 2 is continually rotated, formation of the adsorption layer and reaction of the adsorption layer are sequentially achieved many times, whereby the reaction products are stacked one above another to form a silicon oxide layer.

During the film forming process, the division gas from the gas nozzles 33, 34 and the purge gas from the gas supply pipe 28 allow the first process gas and the second process gas to be discharged without being mixed with each other. In addition, since a purge gas is supplied under the rotary table 2 through a gas supply pipe (not shown), a gas which would otherwise spread under the rotary table 2 can be directed to the exhaust hole 36, 37 by the purge gas.

In the film formation apparatus 1 according to the present disclosure, which supplies the process gas to the wafer W loaded onto the rotary table 2 through each of the gas nozzles 31, 32 securely supported at one side thereof by the gas supply port 4 constituting the sidewall 13A of the hermetic vacuum chamber 11, the gas nozzles 31, 32 are pressed against the annular stepped surface 47A of the through-hole 43 through the spacer 6 with which the proximal end of each of the gas nozzles 31, 32 is engaged, within the gas supply port 4. Thus, the spacer 6 makes lifting of the proximal ends of the gas nozzles 31, 32 difficult. In other words, the spacer makes downward movement of the leading ends of the gas nozzles 31, 32 above the rotary table 2 difficult. Thus, even when the seal members MA, MB which are in close contact with the gas nozzles 31, 32 and the gas supply port 4 and which support the gas nozzle 31 soften due to long term use, it is possible to prevent deflection of the leading ends of the gas nozzles 31, 32. As a result, it is possible to prevent film thickness at each in-plane portion of the wafer W from deviating from a design value due to deviation of distances between each in-plane portion of the wafer W and the gas nozzles 31, 32 from a design value. In addition, when wafers W are subjected to film forming process using a plurality of film formation apparatuses, it is possible to inhibit variation in film thickness between the wafers W treated by the respective film formation apparatuses.

Figure 13:
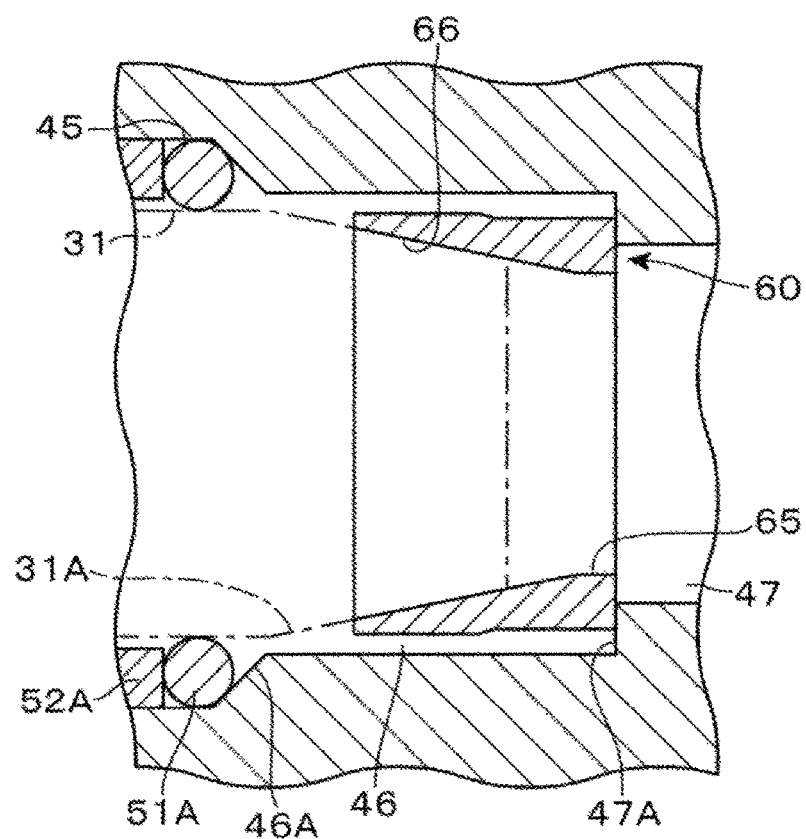
FIG. 13 is a side view of a vertical section of another spacer.

Next, a spacer according to another embodiment will be described, focusing on the difference with the spacer 6. FIG. 13 is a side view of a vertical section of a spacer 60 according to another embodiment. The spacer 60 is formed of, for example, a resin such as polytetrafluoroethylene. The spacer 60 is different from the spacer 6 in terms of the shape of an inner circumferential surface. An inner circumferential surface of an outer end of the spacer 60 is a parallel surface 65 that is parallel to an axial direction of the spacer 60. A incline surface 66 inclined in the axial direction is formed from an inner end of the parallel surface 65 to an inner end of the spacer 60 such that an opening of the spacer 60 has an increasing diameter towards the inner end of the spacer 60.

A portion of the incline surface 31A of the gas nozzle 31 spaced apart from the proximal end of the gas nozzle 31 toward the leading end of the gas nozzle is engaged with the incline surface 66 of the spacer 60. Since the spacer 60 is formed of a resin and is thus relatively soft, the gas nozzle 31 is unlikely to be damaged even when the proximal end of the gas nozzle 31 is brought into contact with the spacer 60 during mounting of the gas nozzle 31 on the gas supply port 4, as described above. Thus, the spacer 60 is also configured to be engaged with the proximal end of the gas nozzle 31. In addition, the spacer 60 does not have a slit 64. This is because the gas nozzle 31 can be easily removed from the spacer 60 since a resin used as a material for the spacer is more flexible than a metal.

As such, the spacer 60 formed of a resin has a higher degree of freedom of shape than the spacer 6 formed of a metal. However, in order to prevent a substance constituting the spacer 60, for example, fluorine, from scattering in the vacuum chamber 11 and being incorporated into a film of the wafer W, it is desirable that the spacer 6 be formed of a metal.

Alternatively, the apparatus 1 may be a surface modifying apparatus in which a gas for generating plasma, as a process gas, is discharged from a gas nozzle 31, and the gas for generating plasma turns into plasma due to a magnetic field generated by an antenna mounted on a ceiling plate 12 of a vacuum chamber 11 and receiving high-frequency power such that a film on a surface of a wafer W is modified by the plasma. That is, the present disclosure is not limited to the film formation apparatus. Alternatively, the apparatus may be an apparatus which performs film forming by chemical vapor deposition (CVD) without the division region D. The gas nozzle may be formed of other ceramics, for example, aluminum ceramics or silicon carbide (SiC) ceramics, instead of quartz.

Evaluation Test

Next, an evaluation test conducted in relation to the present disclosure will be described. The gas nozzles 31 to 34 were mounted on the respective gas supply ports 4 of the film formation apparatus 1 using the spacer 6. Unlike the embodiment as described above, three gas nozzles 32 were mounted on different gas supply ports 4. In other words, in this test, seven gas nozzles were mounted on the gas supply ports 4 in total. Height H1 of the leading end of each of the gas nozzles from the rotary table 2 was measured.

After completion of mounting of the gas nozzles 31 to 34, the gas nozzles were allowed to stand for 55 days while a process of increasing internal temperature of the vacuum chamber 11 from 276 degrees C. to 288 degrees C., followed by lowering the temperature from 288 degrees C. to 276 degrees C. was repeated 20 times for that period of time. In addition, for these 55 days, the inside of the vacuum chamber 11 was returned to room temperature once. When 55 days elapsed after mounting of the gas nozzles, height H2 of the leading end of each of the gas nozzles from the rotary table 2 was measured, followed by comparing the height H1 with the height H2. For each gas nozzle, a difference between the height H1 and the height H2 was less than 0.2 mm, which does not cause any problem in terms of practical use. Therefore, the effects of the present disclosure were confirmed. Furthermore, after measurement of the height H2, each of the gas nozzles was easily removed from the spacer 6. This is thought to be due to the presence of the slit 64.

According to the present disclosure in some embodiments, it is possible to provide a substrate processing apparatus which supplies a process gas to a substrate through a gas nozzle securely supported at one side thereof by a sidewall of a hermetic process chamber, wherein the gas nozzle is pressed against a stepped surface of a hole portion in the sidewall of the process chamber, with a proximal end of the gas nozzle engaged with an annular spacer in the sidewall of the process chamber. Thus, the annular spacer makes it difficult to lift the proximal end of the gas nozzle. In other words, the spacer makes it difficult for a leading end of the gas nozzle to be moved down. Thus, even when a seal member softens due to long term use, it is possible to prevent displacement of the gas nozzle (deflection of the gas nozzle).

While certain embodiments have been described, these embodiments have been presented by way of example only, and are not intended to limit the scope of the disclosure. Indeed, the embodiments described herein may be embodied in a variety of other forms. Furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A substrate processing apparatus which supplies a process gas to a substrate placed in a hermetic process chamber to perform substrate processing, comprising:
    a first hole portion formed through an inner circumferential surface of a sidewall of the process chamber and horizontally extending outward, the first hole portion having a circular cross-section;
    a second hole portion formed to be contiguous with an outer end of the first hole portion and defining a supply channel for the process gas, the second hole portion being concentric with the first hole portion and having a smaller diameter than the first hole portion and a circular cross-section;
    a gas nozzle, a proximal end of which is inserted into the first hole portion through an inner end of the first hole portion, the gas nozzle being configured to supply the process gas from the second hole portion to the substrate;
    a plurality of seal members spaced apart from each other in a longitudinal direction of the gas nozzle between an outer circumferential surface of the gas nozzle and the first hole portion, each of the seal members being formed in an annular shape in a circumferential direction of the gas nozzle; and
    an annular spacer inserted into the outer end of the first hole portion and pressed against an annular surface of an opening periphery of the second hole portion by the gas nozzle in a state where the proximal end of the gas nozzle is engaged with the annular spacer.

2. The substrate processing apparatus of claim 1, wherein a circumferential surface of the proximal end of the gas nozzle and a circumferential surface of the spacer with which the proximal end of the gas nozzle is engaged are inclined in an axial direction.

3. The substrate processing apparatus of claim 2, wherein an outer circumferential surface of the proximal end of the gas nozzle decreases in diameter toward an outside of the process chamber, and an inner circumferential surface of an inner end of the spacer increases in diameter toward an inside of the process chamber to allow the outer circumferential surface of the proximal end of the gas nozzle, such that the outer circumferential surface of the proximal end of the gas nozzle and the inner circumferential surface of the inner end of the spacer are engaged with each other.

4. The substrate processing apparatus of claim 3, wherein the gas nozzle is formed of quartz; the spacer is formed of a metal; and the outer circumferential surface of the gas nozzle is engaged with the spacer at a portion of the outer circumferential surface of the gas nozzle spaced apart from the proximal end of the gas nozzle toward the inside of the process chamber, and a tip of the outer circumferential surface of the proximal end of the gas nozzle is spaced apart from the inner circumferential surface of the spacer.

5. The substrate processing apparatus of claim 2, wherein the gas nozzle is formed of quartz; the spacer is formed of a metal; and the spacer has a slit formed in an inside end of the process chamber toward the outside of the process chamber.

6. The substrate processing apparatus of claim 1, wherein the gas nozzle is formed of quartz; the spacer is formed of a metal; and the spacer has a clearance of 0.05 mm to 0.20 mm from the first hole portion in a radial direction of the first hole portion.

7. The substrate processing apparatus of claim 1, wherein a rotary table configured to be loaded with the substrate and to revolve the substrate is placed in the process chamber; the gas nozzle is placed above a region through which the substrate passes as the rotary table is rotated and has discharge holes configured to discharge the process gas in a longitudinal direction of the gas nozzle; and processing of the substrate is a film forming process performed under a vacuum.

* * * * *